United States Patent [19]

Tanigawa

[11] Patent Number: 4,814,724

[45] Date of Patent: Mar. 21, 1989

[54] GAIN CONTROL CIRCUIT OF CURRENT MIRROR CIRCUIT TYPE

[75] Inventor: Hiroshi Tanigawa, Tsurugashima, Japan

[73] Assignee: Toko Kabushiki Kaisha, Tokyo, Japan

[21] Appl. No.: 72,294

[22] Filed: Jul. 13, 1987

[30] Foreign Application Priority Data

Jul. 15, 1986 [JP] Japan .......................... 61-108572[U]
Jul. 16, 1986 [JP] Japan ............................... 61-167305

[51] Int. Cl.$^4$ ............................................. H03F 3/04
[52] U.S. Cl. .................................... 330/288; 323/315; 330/278
[58] Field of Search ....................... 330/257, 278, 288; 323/315, 316

[56] References Cited

FOREIGN PATENT DOCUMENTS 156006 12/1981 Japan ................................... 330/288

OTHER PUBLICATIONS

Radovsky, "Universal Current Mirror", *RCA Technical Notes*, TN No. 1132, Oct. 28, 1975.

*Primary Examiner*—James B. Mullins
*Attorney, Agent, or Firm*—Stevens, Davis, Miller & Mosher

[57] ABSTRACT

A gain control circuit of the current mirror circuit type in which a current source for a first current mirror circuit is constituted with the output stage of another current mirror circuit. Among the junctions of the first current mirror circuit and the another current mirror circuit, the bias side junction of the first current mirror circuit is used as an input terminal and the other as an output terminal. A predetermined current is supplied to a resistor connected to the emitter of the bias side transistor of the first current mirror circuit to obtain a predetermined gain. Application of a signal to the resistor, which signal is opposite in phase to an input signal, serves to cancel the influence of the input signal to thereby eliminate fluctuations in the gain.

5 Claims, 2 Drawing Sheets

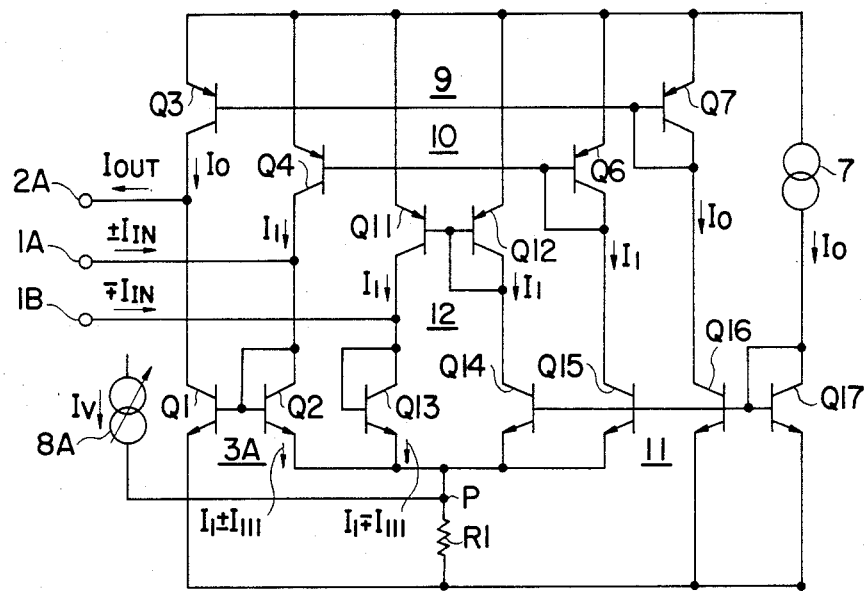
F I G. 3

4,814,724

GAIN CONTROL CIRCUIT OF CURRENT MIRROR CIRCUIT TYPE

BACKGROUND OF THE INVENTION

1. Field of the Invention

This invention relates to a gain control circuit of the current mirror circuit type suitable for use in a semiconductor integrated circuit.

2. Description of the Prior Art

FIG. 4 shows one example of conventional gain control circuits of the current mirror circuit type which include a current mirror circuit comprising a transistor Q1 and a transistor Q2 in diode connection, an input signal source 9 and a variable resistor R. This gain control circuit further includes an output terminal designated by reference numeral 2. When the value of the variable resistor R connected to the emitter of the transistor Q2 is changed, the voltage V across the resistor is changed, so that the base potential of transistor Q1 varies. This allows the output current $I_2$ to be changed to thereby control the current gain.

In such a gain control circuit, assuming that the signal current is $I_1$, the output current is $I_2$, the voltage across the base and emitter of the transistor Q1 is $V_{BE1}$, the forward voltage across the transistor Q2 in diode connection is $V_{BE2}$, and the voltage across resistor R is V, the relationships expressed below hold:

$$I_1 = I_S \cdot A_1 \quad (1),$$

$$I_2 = I_S \cdot A_2 \quad (2),$$

and $$V_{BE1} = V_{BE2} + V \quad (3).$$

The factor A(A1, A2) in the above equations is defined as follows:

$$A_1 = \exp V_{BE1}/V_T \text{ and}$$

$$A_2 = \exp V_{BE2}/V_T$$

where $V_T$ is a thermal voltage and $I_s$ is a backward saturation current. The relationship between the signal current $I_1$ and the output current $I_2$ is derived from the above equations (1), (2) and (3) as follows:

$$I_2 = I_1 \cdot A \quad (4).$$

The factor $A(A_1, A_2)$ in the above equation (4) can be also expressed as:

$$A = \exp V_{BE}/V_T$$

since the voltage across the corresponding bases and emitters of transistors formed on the same semiconductor substrate are regarded as being substantially equal to one another. Therefore, the output current $I_2$ is set to a value A times larger than the input current $I_1$, as shown in the above equation (4). Namely, by changing the value of the variable resistor R to vary the voltage thereacross, the gain of the amplifier circuit of the current mirror circuit type is set to any desired value.

However, since the variable resistor R is necessary to be connected to the emitter of the transistor Q2 externally in the circuit shown in FIG. 4, an external leading terminal is required. Accordingly, the circuit of FIG. 4, as it is, is not suitable for semiconductor circuit integration.

Ordinarily, there is difficulty in operating the current amplifier type gain control circuit of FIG. 4 by using a low voltage source less than 1 volt. The current mirror circuit constituting the gain control circuit has also the drawback that non-matching of diode characteristics resulting from the combination of transistors of different conductivity types will cause an offset current.

Further drawback with the current mirror circuit type gain control circuit is that distortion of the output may occur by the influence of the input signal.

SUMMARY OF THE INVENTION

This invention is intended to eliminate the above drawbacks. It is a main object of this invention to provide a gain control circuit of the current mirror circuit type which gain is easy to control.

It is another object of this invention to provide a gain control circuit of the current mirror circuit type which is operable at a voltage of 1 volt or less.

It is a further object of this invention to provide a gain control circuit of the current mirror circuit type in which little offset current flows.

It is a still further object of this invention to provide a gain control circuit of the current mirror circuit type in which its output signal is not distorted by the influence of the input signal.

In order to achieve these objects, this invention provides a gain control circuit constituted with current mirror circuits, which is suitable for implementation of a semiconductor integrated circuit without use of any variable resistor, and which is capable of performing a stabilized gain control. According to the present invention, a gain control circuit of the current mirror circuit type in which a current source for a first current mirror circuit is constituted with the output stage of another current mirror circuit. Among the junctions of the first current mirror circuit and the another current mirror circuit, the bias side junction of the first current mirror circuit is used as an input terminal and the other as an output terminal. A predetermined current is supplied to a resistor connected to the emitter of the bias side transistor of the first current mirror circuit to obtain a predetermined gain. Application of a signal to the resistor, which signal is opposite in phase to an input signal, serves to cancel the influence of the input signal to thereby eliminate fluctuations in the gain.

Typical embodiments of this invention will be described with reference to the accompanying drawings.

BRIEF DESCRIPTION OF THE DRAWINGS

In the drawings:

FIG. 3 is a circuit diagram showing a further embodiment of a gain control circuit of the current mirror circuit type according to this invention.

DESCRIPTION OF THE PREFERRED EMBODIMENTS

The current mirror circuit type gain control circuit according to this invention will be described in connection with the embodiments thereof shown in FIGS. 1 to 3.

Figure 1:
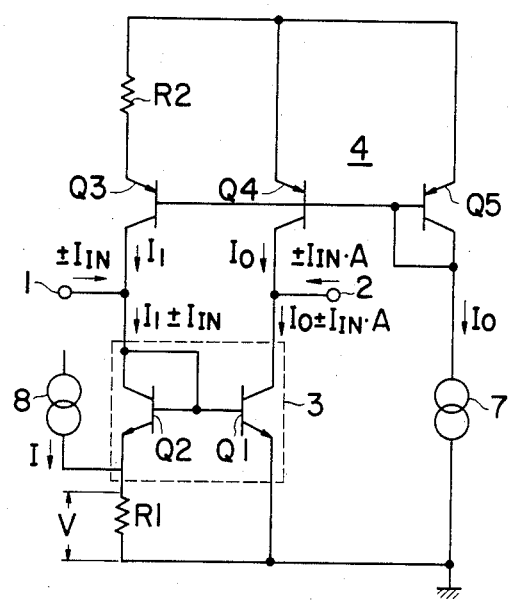
FIG. 1 is a circuit diagram showing one embodiment of a gain control circuit of the current mirror circuit type according to this invention.

FIG. 1 shows one embodiment of a circuit arrangement of a gain control circuit according to the present invention. This gain control circuit includes a current mirror circuit 3 comprising a transistor Q1 and a transistor Q2 in diode connection. This circuit further includes current source transistors Q3 and Q4 which supply currents to the current mirror circuit 3, these transistors Q3 and Q4 forming another current mirror circuit 4 together with a transistor Q5. The base and collector of the transistor Q5 are grounded via a current source circuit 7. The junction of the collectors of transistors Q2 and Q3 is connected to an input terminal 1 while the junction of the collectors of transistors Q1 and Q4 is connected to an output terminal 2. A current source circuit 8 is connected to the junction of the transistor Q2 and a resistor R1.

Figure 4:
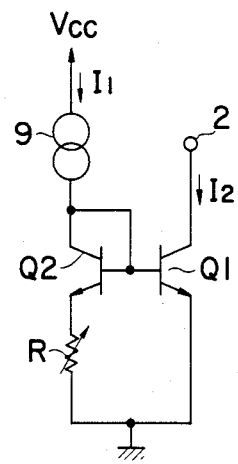
FIG. 4 is a circuit diagram of one example of conventional gain control circuits of the current mirror circuit type.

The operation of such a gain control circuit of the current mirror circuit type will be now described. A mirror current $I_1$, limited by a resistor R2 via the current source transistor Q3, and a mirror current $I_0$ via the current source transistor Q4 are supplied to the current mirror circuit 3. An input signal current ($\pm I_{IN}$) is input from the input terminal 1 and superposed on the mirror current $I_1$ and thus the current ($I_1 \pm I_{IN}$) is supplied to the transistor Q2. A constant current I is supplied from the current source circuit 8 to obtain a fixed gain. From the output terminal 2, an output current ($\pm I_{IN} \cdot A$) is output as described in the conventional example of FIG. 4. It is to be noted that A is expressed as exp $V_{BE}/B_T$ as mentioned above. The voltage V across resistor R1 is given by $$V = [(I_1 \pm I_{IN}) + I] \cdot R1.$$

Therefore, by setting the constant current I supplied from the current source circuit 8 to a predetermined value, a gain control circuit of the current mirror circuit type which can easily have a desired gain is provided Now, another embodiment of the invention shown in FIG. 2 will be described. In the FIG. 1 embodiment, an offset current is produced by non-matching based on the difference between the diode characteristic (I-V characteristic) of the PNP transistor Q3 and that of the NPN transistor Q2 in diode connection, namely, based on the difference between the manners in which the currents flow through transistors Q3 and Q2. Similarly, an offset current is produced between PNP and NPN transistors Q4 and Q1 due to non-matching based on the difference between the diode characteristics (I-V characteristics) of transistors Q4 and Q1. Especially, when the source voltage is high, the offset current is negligible, but the offset current produced due to the difference between the diode characteristics of the PNP and NPN transistors when these transistors are operated with a low voltage source less than 1 volt, is remarkable which is an unwanted problem. In such a case, the offset current can be easily eliminated by the embodiment as shown in FIG. 2.

Figure 2:
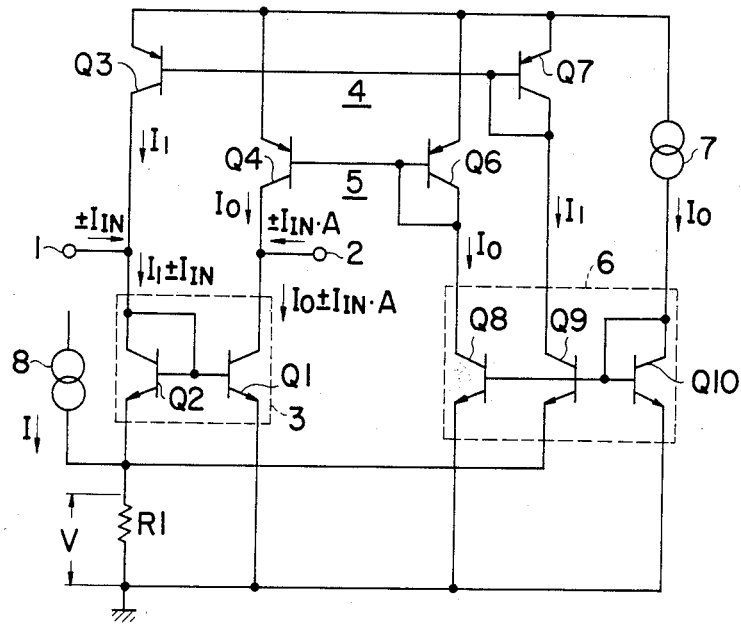
FIG. 2 is a circuit diagram showing another embodiment of a gain control circuit of the current mirror circuit type according to this invention.

In FIG. 2, the current source transistors Q3 and Q4 for the current mirror circuit 3 constitute the output stages of current mirror circuit 4 and 5, respectively. These transistors constituting the output stages are controlled by a current mirror circuit 6. The transistors Q6 and Q7 provided on the bias sides of the current mirror circuits 4 and 5 are connected to transistors Q8 and Q9 of the current mirror circuit 6, respectively. This current mirror circuit 6 is constituted with a transistor Q10 in diode connection and transistors Q8 and Q9, the emitter of the transistor Q9 being connected to the junction of the resistor R1 and the transistor Q2.

The current mirror circuit 6 is formed of NPN transistors similar to those of the current mirror circuit 3. Mirror currents $I_1$ and $I_0$ supplied to the current mirror circuit 3 flow through the current mirror circuit 6 formed of NPN transistors and through the current mirror circuits 4 and 5. Therefore, currents having the I-V characteristics the same with the transistors Q8 and Q9 flow through the current mirror circuit 3, so that matching is maintained and an offset current produced due to the difference between the diode characteristics of transistors of different conductivity types can be completely eliminated.

A collector current ($I_1 \pm I_{IN}$) flows through the collector of the transistor Q2 while a current ($I_0 \pm I_{IN} \cdot A$) flows through the transistor Q1. This means that a current $\pm I_{IN} \cdot A$ can be obtained from the output terminal 2. From the Current source circuit 8, a constant current I is delivered to the resistor R1 to make a setting of a predetermined gain. Of course, a variable current may be delivered via the current source circuit 8 to the resistor R1 to easily control the gain of the amplifier circuit of the current mirror circuit type.

However, when the signal current $I_{IN}$ supplied to the resistor R1 changes greatly in the mirror circuit type gain control circuits shown in FIGS. 1 and 2, the voltage across resistor R1 may change disadvantageously, which is to be improved. In such a case, fluctuations in the signal current $I_{IN}$ will cause fluctuations in the gain of the current mirror circuit to thereby cause a distortion in the output. A further embodiment of the invention shown in FIG. 3 will provide a gain control circuit having improved characteristic to eliminate such drawbacks.

The embodiment of FIG. 3 will now be described. The gain control circuit of this embodiment includes input terminals 1A and 1B to which input signals having phases opposite to each other are respectively input, an output terminal 2A. This circuit further includes a variable current source circuit 8A for control of gain, a constant current source circuit 7 similar to that in the FIG. 2 embodiment, and current mirror circuits 3A and 9 to 12. The current mirror circuit 3A is constituted with transistors Q1 and Q2 in diode connection. The current source transistors Q3 and Q4 for the current mirror circuit 3A form current mirror circuits 9 and 10 together with transistors Q7 and Q6 in diode connection, respectively. The collectors and bases of transistors Q6 and Q7 are connected to the corresponding collectors of transistors Q15 and Q16 which form a current mirror circuit 11 together with a transistor Q14 and a transistor Q17 in diode connection. In addition, transistors Q11 and Q12 form a current mirror circuit 12 with the collector of the transistor Q11 being connected to the base and collector of a transistor Q13 in diode connection to form a current source circuit so that the mirror current $I_1$ supplied from the current mirror circuit 11 flows through resistor R1. The junction of the transistors Q11 and Q13 is connected to the input terminal 1B. The base and collector of transistor Q12 are connected to the collector of the transistor Q14. The emitters of the transistors Q2 and Q13 to Q15 are connected commonly to the resistor R1.

In such a gain control circuit of the current mirror circuit type, the input terminal 1A is supplied with an input signal current ($\pm I_{IN}$) while the input terminal 1B is supplied with an input signal current ($\mp I_{IN}$) which is Opposite in phase to and synchronous with the input signal current ($\pm I_{IN}$) delivered to the input terminal 1A. On the other hand, the transistors Q2 and Q13 in diode connection are supplied with mirror currents $I_1$ via the mirror circuit 10 and 12, respectively. The input signals supplied from input terminals 1A and 1B are superposed on their mirror currents $I_1$. Thus, the resulting currents ($I_1 \pm I_{IN}$) and ($I_1 \mp I_{IN}$) are supplied to transistors Q2 and Q13, respectively. Therefore, the input signal components ($\pm I_{IN}$) and ($\mp I_{IN}$) opposite in phase cancel each other at the junction P of the transistors Q2 and Q13 to Q15 and the resistor R1. Thus, the dc component $I_1$ alone flows through the resistor R1. Namely, when a variable current $I_v$ is delivered from the variable current source circuit 8A to the junction P, current ($I_1 + I_v$) flows through the resistor R1. Accordingly, a voltage ($I_1 + I_v$)·R1 is produced across the resistor R1. The voltage across the resistor is applied as a bias voltage to transistor Q1. Thus, the voltage across the resistor R1 varies in accordance with changes in the variable current $I_v$, whereby the gain of the current mirror circuit 3A is set. Since the input signal components cancel each other, even if the voltage across the resistor R1 varies, there is no possibility that the bias voltage to transistor Q1 changes. When the control current $I_v$ from the variable current source circuit 8A is fixed, the gain of current mirror circuit 3A is constant while when the control current $I_v$ is changed, the gain of the current mirror circuit 3A can be controlled without distorting its output signal.

It is to be noted that the output current $I_{out}$ of the gain control circuit of the current mirror circuit type shown in FIG. 3 is determined by the input current $I_{IN}$ and A as previously explained using equation (4).

In the gain control circuit of the current mirror circuit type according to this invention, the voltage loss includes only the saturation voltage $V_{CE(sat)}$ of the transistor, the base-emitter voltage $V_{BE}$ of the transistor and the voltage V across resistor R1. Therefore, by suppressing the voltage loss across resistor R1 to a low value, the gain control circuit is very effective to operate satisfactorily at about 0.9 volts of the source voltage.

The gain control circuit of the current mirror circuit type according to this invention can serve as an amplifier circuit of the current mirror circuit type with an excellent gain control means, which is easy to eliminate an offset current, which has no possibility that the gain changes depending on the amplitude of the input signal, and which has no distortion in the output. Thus, such a circuit will be very effective as an acoustic gain control circuit.

The gain control circuit of the current mirror circuit type according to this invention is also suitable for forming semiconductor integrated circuits such as gain control circuits, low voltage electronic volumes or attenuators.

What is claimed is:

1. A gain control circuit of the current mirror circuit type comprising:
    a first current mirror circuit including a first and a second transistor, said second transistor being in diode connection;
    a third and a fourth transistor for a current source each connected to said first current mirror circuit;
    another current mirror circuit having an output stage which includes said third and fourth transistors for the current source;
    a junction of said second and third transistors serving as an input terminal;
    a junction of the first and fourth transistors serving as an output terminal;
    a resistor connected to a emitter of said second transistor; and
    a current source circuit connected to a junction of said second transistor and said resistor whereby a predetermined current is supplied from said current source circuit to said resistor to obtain a predetermined gain.

2. A gain control circuit of the current mirror circuit type as set forth in claim 1, wherein said another current mirror circuit comprises a transistor in diode connection in addition to said third and fourth transistors.

3. A gain control circuit of the current mirror circuit type comprising:
    a first current mirror circuit including a first and second transistor, said second transistor being in diode connection;
    a third and a fourth transistor (i) each connected to said first current mirror circuit and (ii) used as a current source for said first current mirror circuit;
    a resistor connected to an emitter of said second transistor;
    a first current source circuit for gain control and connected to a junction of said emitter of said second transistor and said resistor;
    a first input terminal connected to a junction of said second and fourth transistors;
    an output terminal connected to a junction of said first and third transistors;
    a second current source circuit connected to said resistor; and
    a second input terminal connected to said second current source circuit;
    whereby an input signal opposite in phase to an input signal supplied to said first input terminal is supplied to said second input terminal.

4. A gain control circuit of the current mirror type as set forth in claim 3, wherein the third and fourth transistors used as said current source for said first current mirror circuit serve as transistors of output stages of second and third current mirror circuits, respectively; said control circuit further comprising bias transistors of said second and third current mirror circuits connected to corresponding transistors of an output stage of a fourth current mirror circuit; said second input terminal is connected to a junction of a transistor of an output stage of a fifth current mirror circuit and a transistor in diode connection, which transistors constitute said second current source circuit; a base of said transistor of said output stage of said fifth current mirror circuit is connected commonly to a collector of a transistor of said output stage of said fourth current mirror circuit; and wherein (i) emitters of the transistors of said output stage of said fourth current mirror circuit connected to said third and fifth current mirror circuits, and (ii) an emitter of said transistor in diode connection of said second current source circuit are connected commonly to said resistor.

5. A gain control circuit of the current mirror circuit type comprising:
- a first current circuit including a first and a second transistor, said second transistor being a diode connection;
- a third and a fourth transistor for a current source connected to said first current mirror circuit;
- a second current mirror circuit including said third transistor and a fifth transistor, said fifth transistor being in diode connection;
- a third current mirror circuit including said fourth transistor and a sixth transistor, said sixth transistor being in diode connection;
- a fifth and sixth transistors of said second and third current mirror circuits being respectively connected to seventh and eighth transistors of an output stage of a fourth current mirror circuit;
- a junction of said second and third transistors serving as an input terminal;
- a junction of said first and fourth transistors serving as an output terminal;
- a resistor connected to an emitter of said second transistor; and
- an emitter of said seventh transistor of said fourth current mirror circuit connected to a junction of said second transistor and said resistor whereby a predetermined current is supplied from said fourth current mirror circuit to said resistor to obtain a predetermined gain.

* * * * *